(12) United States Patent
Jeon

(10) Patent No.: US 10,398,048 B2
(45) Date of Patent: Aug. 27, 2019

(54) FOLDABLE DISPLAY DEVICE

(71) Applicant: LG Display Co., Ltd., Seoul (KR)

(72) Inventor: Yongjoon Jeon, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 16/137,403

(22) Filed: Sep. 20, 2018

(65) Prior Publication Data

US 2019/0104626 A1 Apr. 4, 2019

(30) Foreign Application Priority Data

Sep. 29, 2017 (KR) .......................... 10-2017-0127085

(51) Int. Cl.
*H05K 5/03* (2006.01)
*H05K 5/02* (2006.01)
*H05K 5/00* (2006.01)

(52) U.S. Cl.
CPC ............. *H05K 5/03* (2013.01); *H05K 5/0017* (2013.01); *H05K 5/0221* (2013.01); *H05K 5/0226* (2013.01)

(58) Field of Classification Search
CPC combination set(s) only.
See application file for complete search history.

(56) References Cited

U.S. PATENT DOCUMENTS

| | | | | |
|---|---|---|---|---|
| 7,548,415 B2* | 6/2009 | Kim | ...................... | G06F 1/1601 345/1.1 |
| 8,213,167 B2* | 7/2012 | Kim | ................... | G02F 1/13336 345/1.1 |
| 8,971,029 B2* | 3/2015 | Wong | ..................... | G06F 1/1641 292/341.17 |
| 9,173,287 B1* | 10/2015 | Kim | ....................... | H05K 1/028 |
| 9,179,559 B1* | 11/2015 | Kim | ....................... | G06F 1/1616 |
| 9,600,035 B2* | 3/2017 | Park | ....................... | G06F 1/1681 |
| 9,697,941 B2* | 7/2017 | Lee | ........................... | H01F 7/20 |
| 9,952,627 B2* | 4/2018 | Aurongzeb | ........... | G06F 1/1641 |
| 10,032,391 B2* | 7/2018 | Kim | ....................... | G09F 9/301 |
| 10,143,098 B1* | 11/2018 | Lee | ....................... | G06F 1/1652 |
| 10,198,041 B2* | 2/2019 | Myeong | ............ | G02F 1/133305 |
| 2012/0147542 A1* | 6/2012 | Kim | ....................... | G06F 1/1601 361/679.28 |
| 2014/0029190 A1* | 1/2014 | Sato | ...................... | G06F 1/1641 361/679.27 |
| 2015/0023030 A1* | 1/2015 | Tsukamoto | ........... | G06F 1/1652 362/419 |
| 2015/0055287 A1 | 2/2015 | Seo | | |
| 2015/0077917 A1 | 3/2015 | Song | | |
| 2015/0370287 A1 | 12/2015 | Ko et al. | | |
| 2017/0060188 A1* | 3/2017 | Han | ....................... | G06F 1/1652 |
| 2017/0061836 A1* | 3/2017 | Kim | ....................... | G09F 9/301 |
| 2017/0123455 A1* | 5/2017 | Park | ....................... | G06F 1/1681 |

(Continued)

OTHER PUBLICATIONS

Extended European Search Report, European Patent Application No. 18196414.9, dated Jan. 25, 2019, 8 pages.

*Primary Examiner* — Lisa Lea-Edmonds
(74) *Attorney, Agent, or Firm* — Fenwick & West LLP

(57) ABSTRACT

A foldable display device is disclosed and, more particularly, a foldable display device having a back cover structure that stably supports the entire area of a display panel without interfering with folding of the display panel is disclosed. Thus, it is possible to safely protect the entire rear side of the display panel.

22 Claims, 13 Drawing Sheets

(56) References Cited

U.S. PATENT DOCUMENTS

| | | | |
|---|---|---|---|
| 2018/0192527 A1* | 7/2018 | Yun | G06F 1/1652 |
| 2019/0036068 A1* | 1/2019 | Kim | H01L 51/5237 |
| 2019/0069421 A1* | 2/2019 | Lee | G06F 1/1652 |
| 2019/0086962 A1* | 3/2019 | Shin | G06F 1/1643 |
| 2019/0090364 A1* | 3/2019 | Shin | H05K 5/0017 |

* cited by examiner

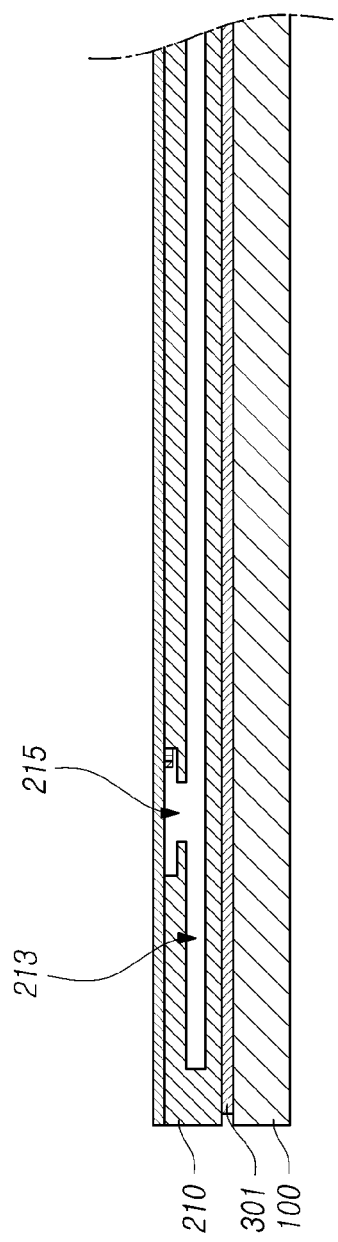

FIG. 6B(1)

FOLDABLE DISPLAY DEVICE

CROSS-REFERENCE TO RELATED APPLICATION

This application claims priority to Republic of Korea Patent Application No. 10-2017-0127085, filed on Sep. 29, 2017, which is incorporated herein by reference in its entirety.

BACKGROUND

Field of the Technology

Embodiments of the present disclosure relate to a foldable display device.

Description of the Related Art

In general, display devices using a flat display panel, such as a liquid crystal display, a plasma display, an organic light emitting display, an electrophoretic display, and an electrowetting display are usually applied to a notebook computer, portable electronic devices, a television, or a monitor.

Recently, not only research and development for compensating the technical defects of flat panel displays, but studies on development of rolling type and folder type display products that can stimulate interest of consumers by using a flexible display panel are being continuously conducted.

When a flexible display panel is applied to a foldable display device, a rigid back cover is usually attached to the rear side of a panel to supplement the rigidity of the display panel that is easily bent or folded.

However, when a display panel having a predetermined thickness is folded, the folded area extends with different lengths on the inner side and the outer side. That is, stronger tension is generated on the outer side than the inner side of a display panel.

In this case, a back cover that supports the display panel is made of a rigid material and has poor elasticity, unlike the display panel, so it may separates from or slips on the display panel due to a change in length of the display panel.

A back cover having a hinged structure is applied to the folding portion of a display panel in some cases to remove this problem.

However, a gap is generated between the folding portion and the hinge structure when a display panel is folded, so the back cover with a hinged structure cannot sufficiently support the folding portion of the display panel. Accordingly, the folding portion of the display panel becomes fragile and is broken or durability is deteriorated, and the lifespan of the display panel is reduced.

SUMMARY

An aspect of the present disclosure is to provide a foldable display device having a back cover structure that can safely and strongly support the entire area of the rear side of a display panel when it is folded.

Another aspect of the present disclosure is to provide a foldable display device having a back cover structure that can firmly support a folding portion of a display panel without separating from or slipping on the display panel even when the display panel is folded.

Another aspect of the present disclosure is to provide a foldable display device having a coupling structure that is suitable for a folding situation and keeps a display panel and a back cover strongly coupled to each other.

Further, the aspects of the present disclosure are not limited thereto, and other unmentioned aspects of the present disclosure may be clearly appreciated by those skilled in the art from the following descriptions.

In accordance with an aspect of the present disclosure, there is provided a foldable display device having a back cover structure that includes flat covers and a folding cover slide-coupled to the flat covers such that when a display panel is folded, the folding cover is folded with the display panel while the folding covers are able to support a folding section of the display panel.

As described above, according to various embodiments of the present disclosure, it is possible to provide a back cover structure that can safely and strongly support the entire rear side of a display panel even in states other than a folding state.

According to embodiments of the present disclosure, in a foldable display device, a display panel does not separate from or slip on a back cover supporting the display panel when the display panel is folded, so the folding section of the display panel can be firmly supported.

Further, according to embodiments of the present disclosure, it is possible to provide a foldable display device that can be stably folded even without a specific mechanism.

Another aspect of the present disclosure is to provide a foldable display device having a coupling structure that is suitable for a folding situation and keeps a display panel and a back cover strongly coupled to each other.

BRIEF DESCRIPTION OF THE DRAWINGS

The above and other aspects, features and advantages of the present disclosure will be more apparent from the following detailed description taken in conjunction with the accompanying drawings, in which:

FIG. 5 is a cross-sectional view taken along line C-C of FIG. 3B according to one embodiment;

DETAILED DESCRIPTION

Figure 1:
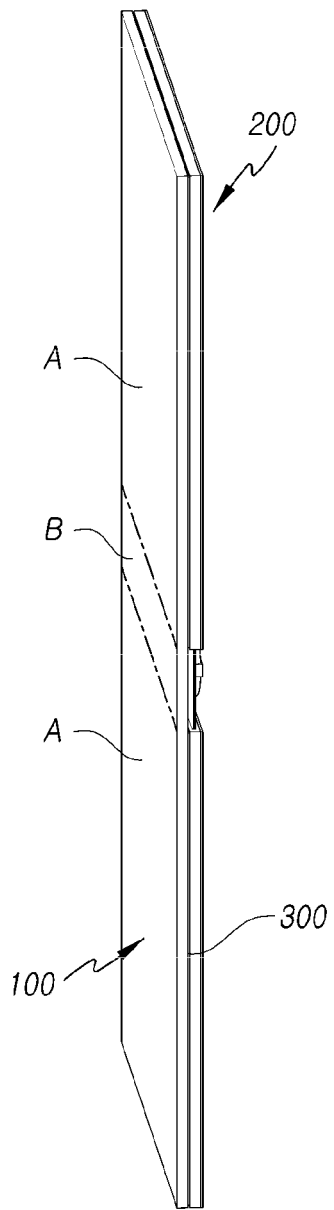
FIG. 1 is a perspective view of a foldable display device according to an embodiment of the present disclosure.

Hereinafter, some embodiments of the present disclosure will be described in detail with reference to the accompanying illustrative drawings. In designating elements of the drawings by reference numerals, the same elements will be designated by the same reference numerals although they are shown in different drawings. Further, in the following description of the present disclosure, a detailed description of known functions and configurations incorporated herein will be omitted when it may make the subject matter of the present disclosure rather unclear.

In addition, terms, such as first, second, A, B, (a), (b) or the like may be used herein when describing components of the present disclosure. Each of these terminologies is not used to define an essence, order or sequence of a corresponding component but used merely to distinguish the corresponding component from other component(s). In the case that it is described that a certain structural element "is connected to", "is coupled to", or "is in contact with" another structural element, it should be interpreted that another structural element may "be connected to", "be coupled to", or "be in contact with" the structural elements as well as that the certain structural element is directly connected to or is in direct contact with another structural element.

Figure 2:
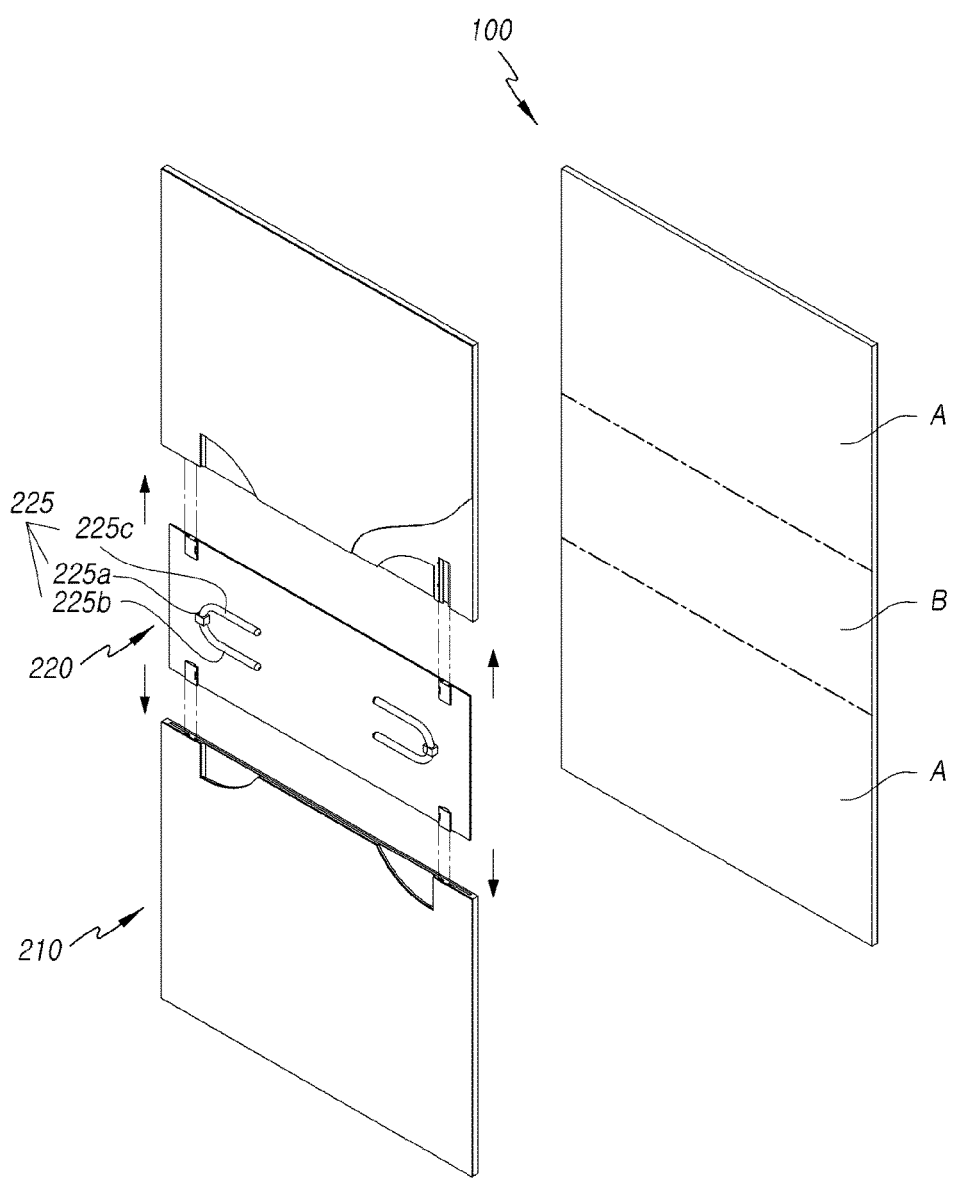
FIG. 2 is an exploded perspective view of the foldable display device according to various embodiments of the present disclosure.
Figure 3A:
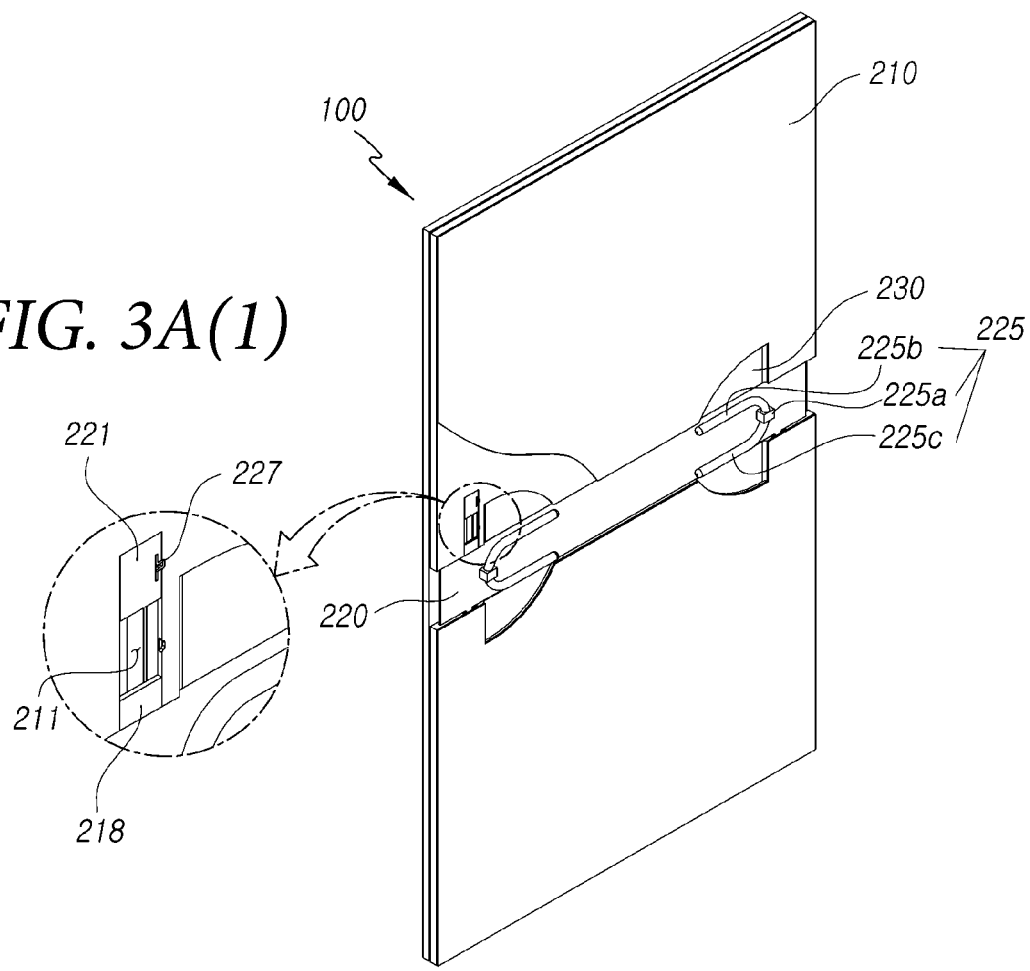
FIGS. 3A, 3A(1), and 3B are views showing the operation of the foldable display device according to various embodiments of the present disclosure.
Figure 3B:
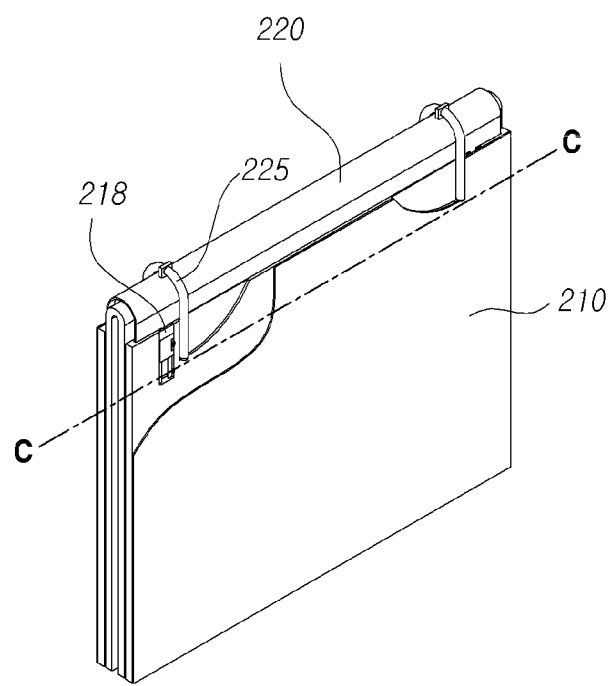
Figure 4A:
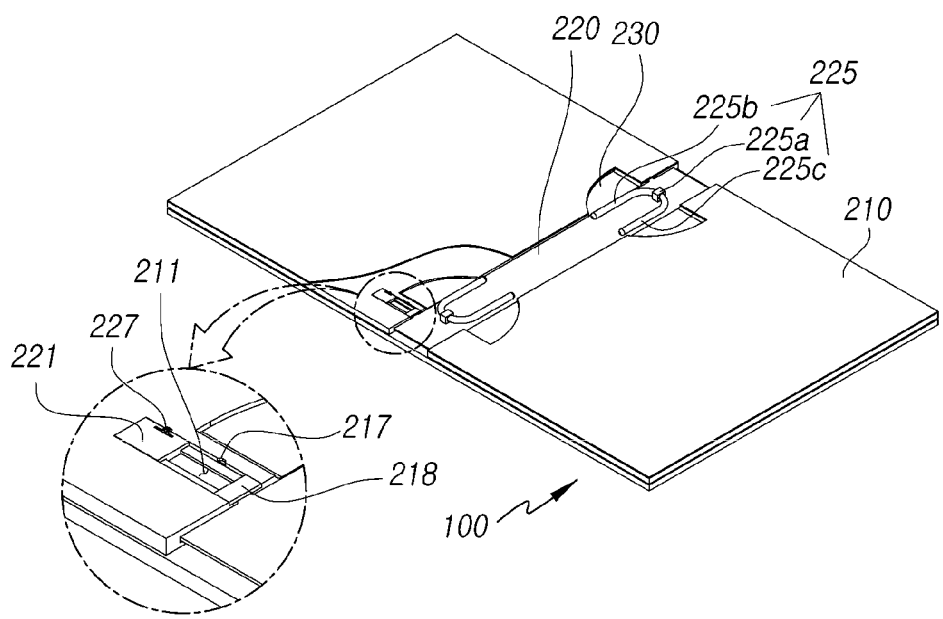
FIGS. 4A, 4A(1), 4B, and 4B(1) are views showing the operation of FIGS. 3A, 3A(1), and 3B at different angle.
Figure 6A:
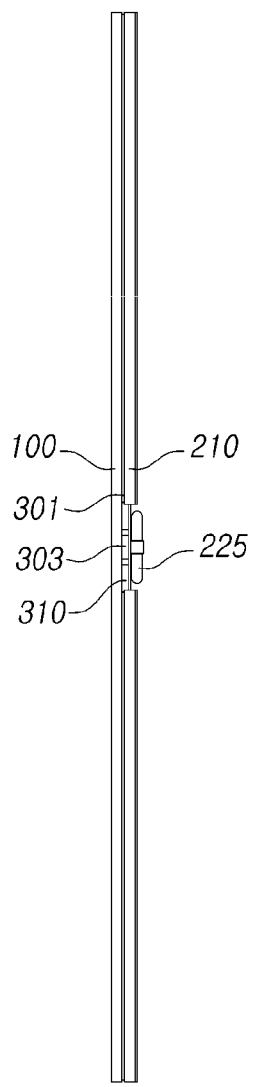
FIGS. 6A, 6B, and 6B(1) are side views of the foldable display device according to various embodiments of the present disclosure.
Figure 6B:
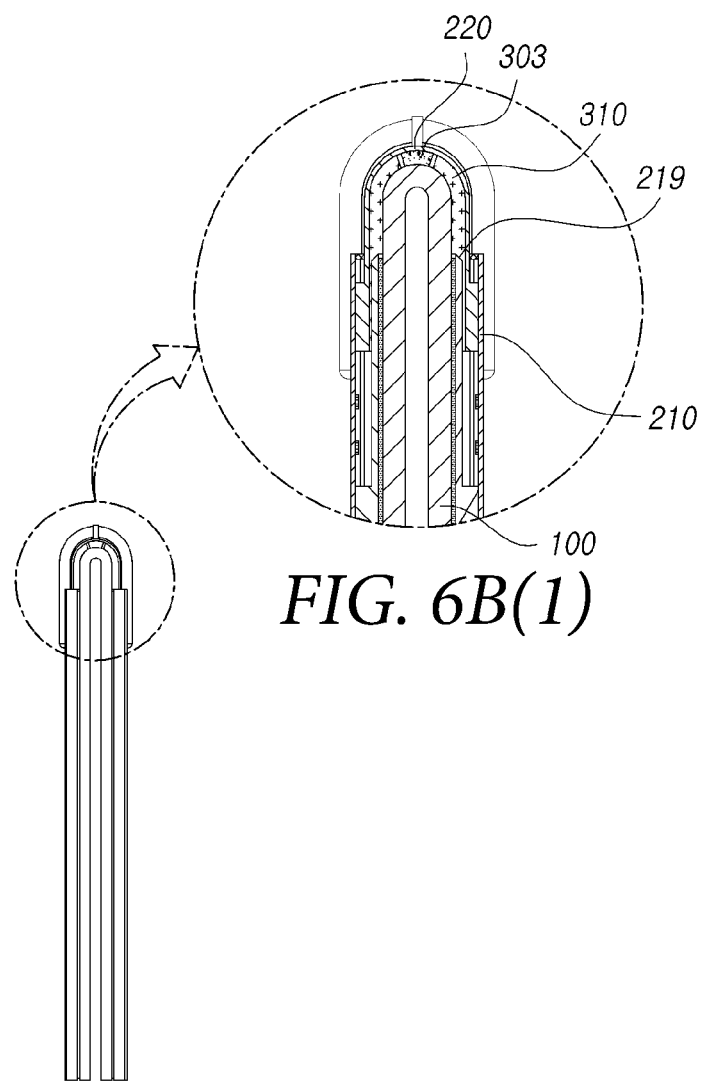
Figure 7A:
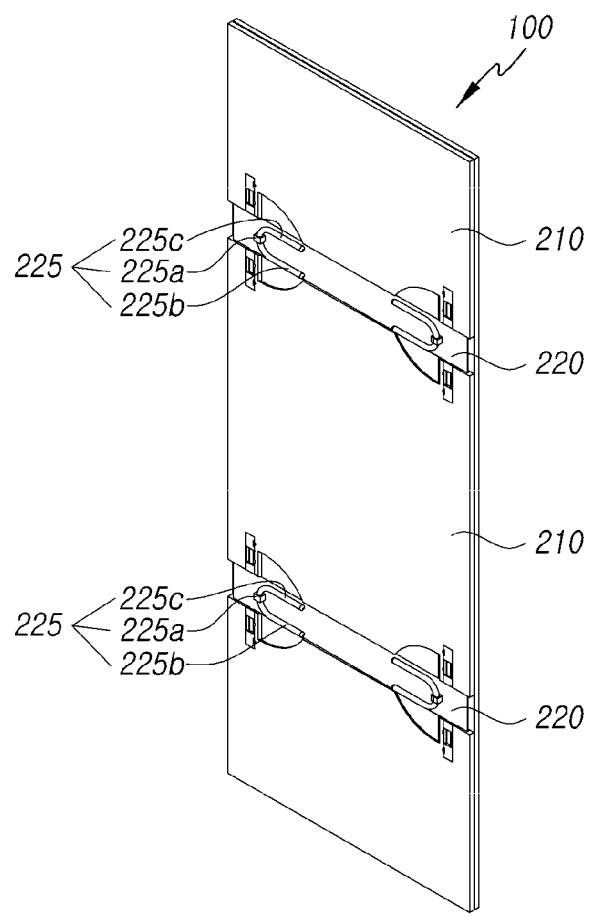
FIGS. 7A and 7B are perspective views of a foldable display device according to a second embodiment of the present disclosure.
Figure 7B:
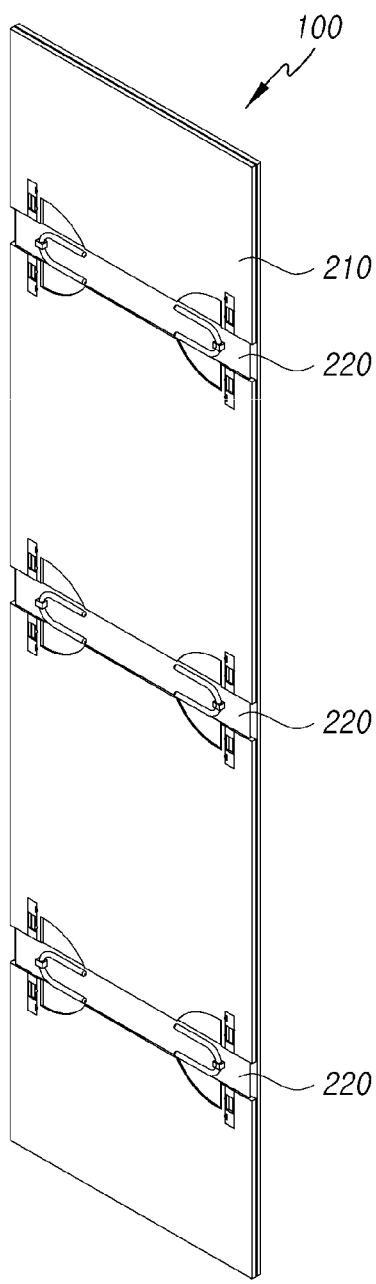
Figure 8:
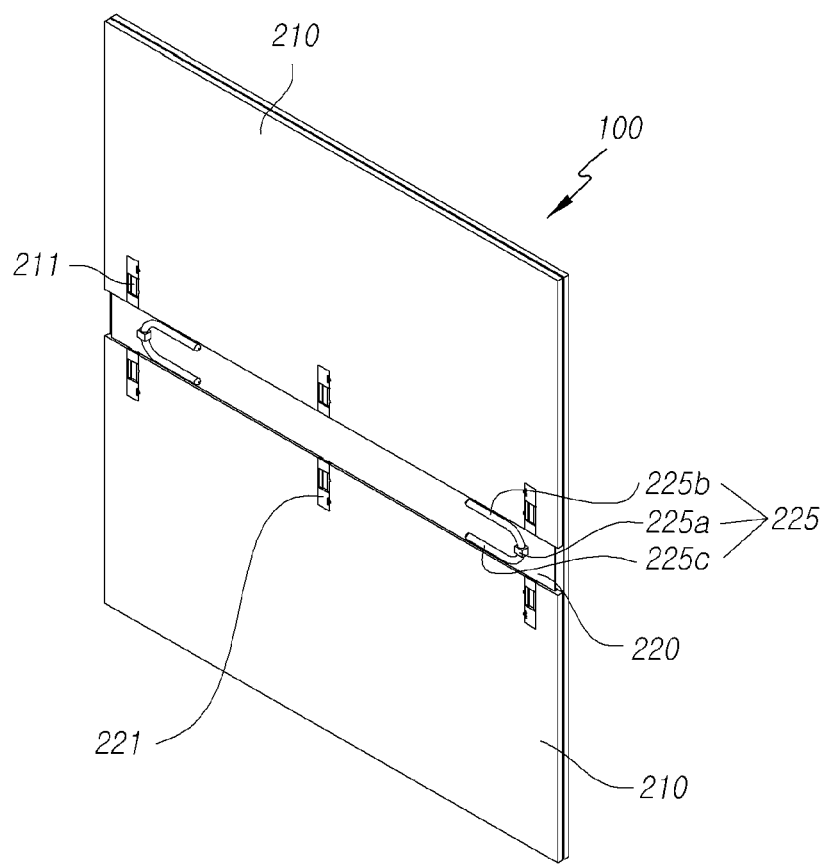
FIG. 8 is a perspective view of a foldable display device according to a third embodiment of the present disclosure.
Figure 9:
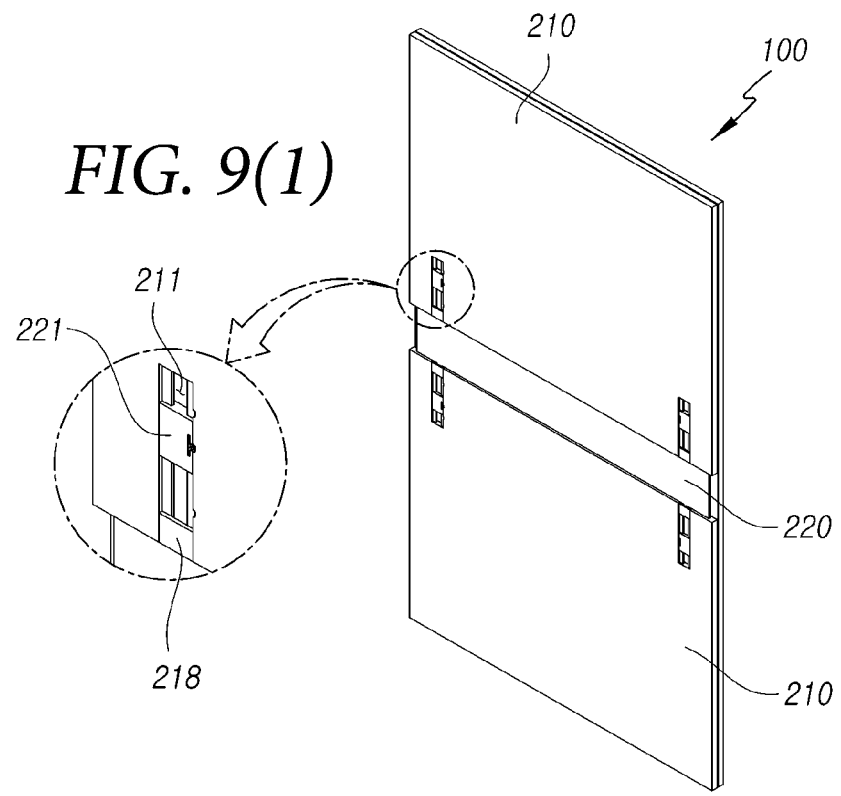
FIGS. 9 and 9(1) are perspective views of a foldable display device according to a fourth embodiment of the present disclosure.

FIG. 1 is a perspective view of a foldable display device according to an embodiment of the present disclosure, FIG. 2 is an exploded perspective view of the foldable display device according to various embodiments of the present disclosure, FIGS. 3A, 3A(1) and 3B are views showing the operation of the foldable display device according to various embodiments of the present disclosure, FIGS. 4A, 4A(1), 4B, and 4B(1) are views showing the operation of FIGS. 3A, 3A(1), and 3B at different angle, FIG. 5 is a cross-sectional view taken along line C-C of FIG. 3B, FIGS. 6A, 6B, and 6B(1) are side views of the foldable display device according to various embodiments of the present disclosure, FIGS. 7A and 7B are perspective views of a foldable display device according to a second embodiment of the present disclosure, FIG. 8 is a perspective view of a foldable display device according to a third embodiment of the present disclosure, and FIGS. 9 and 9(1) are perspective views of a foldable display device according to a fourth embodiment of the present disclosure.

Referring to FIG. 1, a foldable display device 10 according to embodiments of the present disclosure includes: a foldable display panel 100, a back cover 200 covering the rear side of the display panel 100, and a coupling member 300 for coupling the display panel 100 and the back cover 200.

The display panel 100 is a foldable flexible panel.

Assuming that the display side for displaying images is a front side in the display panel 100, the back cover 200 is disposed on the rear side of the display panel 100, thereby supporting the display panel 100.

The display panel 100 may be one of a liquid crystal display (LCD), a plasma display panel (PDP) device, a field emission display (FED) device, an electroluminescence display (ELD) device, and an organic light emitting diode (OLED) and can be implemented to be light and thin using self-emitting elements without additional specific light source, and an OLED that is used the most for flexible displays is exemplified.

The display panel 100 including OLEDs has a structure in which a substrate having driving transistors and light emitting diodes thereon is encapsulated by a protective film. The structure of the display panel 100 including OLEDs is well-known in the art, so it is not described in detail herein.

The protective film over the driving transistors and the light emitting diodes includes a face seal material having multiple layers and the face seal material includes a metallic material. Alternatively, the protective film itself may be a thin face seal metal.

The substrate of the display panel 100 is made of a plastic material such as polyimide, so the entire panel is flexible. Accordingly, the display panel 100 can be folded in the entire area.

However, when only the display panel 100 is provided, the components on the substrate can be easily damaged by external shock, so it is required to make only a specific area foldable and supplement rigidity of the other areas to keep the areas flat. It is possible to define, in the display panel 100, the portion corresponding to the folding area as a folding section B and the portions at both sides of the folding section B as flat sections A.

The back cover 200 covers the rear side of the display panel 100. The back cover 200 may be described with various terms such as a back plate.

The back cover 200 may be made of one metallic plate, but may be formed by combining the same plates so that other components such as a slide groove 211 (shown in FIGS. 3A, 3A(1), 4A, 4A(1), 4B, 4B(1), 9, and 9(1)) to be described below can be easily formed.

Referring to FIG. 2, the back cover 200 may include flat covers 210 respectively covering the flat sections A of the display panel 100 and a folding cover 220 covering the folding section B of the display panel 100.

The flat covers 210 are made of material having sufficient rigidity such as metal to supplement strength of the flat section A by supporting the flat section A in the display panel 100. The flat covers 210 may be formed in rectangular shapes corresponding to the display panel 100.

Since the flat sections A are disposed at both sides of the folding section B in the display panel 100, the flat covers 210 may be provided as a pair of rectangular covers spaced from each other to cover the flat sections A of the display panel 100 when the display panel 100 is folded at the folding section B.

If one or more folding sections B are provided in the display panel 100, a plurality of flat sections A is provided to correspond to the folding sections B and a plurality of flat covers 210 is provided to correspond to the flat sections A.

The folding cover 220 covers and supports the folding section B of the display panel 100. The folding cover 220 may be a rectangular cover, similar to the flat covers 210.

The flat covers 210 and the folding cover 220 may be made of the same material. However, the flat covers 210 require rigidity to cover the flat sections A of the display panel 100, and the folding cover 220 is folded with the folding section B, as described below, so it requires rigidity for supporting the folding section B and predetermined elasticity. Accordingly, the flat covers 210 and the folding cover 220 may be different in thickness and material.

For example, the folding cover 220 may be made of stainless steel (SUS) or an aluminum alloy having both rigidity and predetermined elasticity, while the flat covers 210 may be made of an alloy having higher rigidity than the folding cover 220.

Alternatively, the flat covers 210 and the folding cover 220 may be made of the same material, but in this case, the folding cover 220 may be formed thinner than the flat covers 210 to be more flexible than the flat covers 210.

The folding cover 220 substantially controls the folding ability of the display panel 100. That is, since the folding cover 220 covers the folding section B of the display panel 100 and is more rigid than the display panel 100, the display panel 100 cannot be folded unless the folding cover 220 is folded.

The flat covers 210 and the folding cover 220 of the back cover 200 are connected to each other and this connection may be achieved in various ways.

In detail, the flat covers 210 each have one or more first coupling portions for connection with the folding cover 220 and the folding cover 220 has one or more second coupling portions for connection with the flat covers 210, so the flat covers 210 and the folding cover 220 can be connected by coupling the first coupling portions and the second coupling portions.

The first coupling portions and the second coupling portions may be various members such that the coupling state of the coupling portions can be changed in accordance with folding of the display panel 100. For example, bellows or hinges may be used to change the coupling state.

When the coupling state of the first coupling portions and the second coupling portions is changed by folding of the display panel 100, the display panel 100 is folded with the folding section B of the display panel 100 and the folding cover 220 in close contact with each other, so the folding cover 220 can support the folding section B.

However, the first coupling portion and the second coupling portion may be slide-coupled.

Referring to FIGS. 2 to 4B, for the slide-coupling between the first coupling portions and the second coupling portions, the first coupling portions may be slide grooves 211 and the second coupling portions may be slide protrusions 221 such that the slide protrusions 221 can be inserted in the slide grooves 211. However, depending on embodiments, the second coupling portions may be the slide grooves 211 and the first coupling portions may be the slide protrusions 221.

In detail, the slide protrusions 221 are formed on the top of the folding cover 220, the slide grooves 211 are formed in the flat covers 210 at the sides of the flat covers 210, which are connected to the folding cover 220, and the slide protrusions 221 are inserted in the slide grooves 211.

That is, the folding cover 220 has one or more second coupling portions, the second coupling portions are the slide protrusions 221 on the top of the folding cover 220, and one or more of the first coupling portions of the flat covers 210 are the slide grooves 211 formed at the sides of the flat covers 210.

Referring to FIG. 5, the slide groove 211 may be comprised of a first slide groove 213 in which the body of the folding cover 220 is inserted and second slide grooves 215 in which one or more second coupling portions protruding on the top of the body of the folding cover 220 are inserted. As described above, the second coupling portions are the slide protrusions 221 and the first coupling portions coupled to the second coupling portions are the second slide grooves 215.

That is, the first slide groove 213 is an insertion groove elongated between both side ends of each of the flat covers 210 such that a side of the body of the rectangular folding cover 220 is inserted, and the second slide grooves 215 are additionally formed in the first slide groove 213 in a shape for receiving the second coupling portions that are the slide protrusions 221 on the top of the body of the folding cover 220. The second slid groove 215 can be formed at one or more positions to correspond to the number of the second connecting portions.

Since the folding cover 220 is inserted in the slide grooves 211 of the flat covers 210, as described above, even though the display panel 100 is folded and the outer side of the folding section B extends, the folding cover 220 compensates for the change in direction by sliding in the flat covers 210, whereby the folding section B and the folding cover 220 do not slip or separate.

Further, when the slide protrusions 221 are formed on the folding cover 220 and the folding cover 220 is slide-coupled to the flat covers 210, separation of the folding cover 220 out of the slide grooves 211 can be minimized.

That is, the folding cover 220 can be separated only in the sliding direction from the slide grooves 211 and separation thereof in the direction perpendicular to the sliding direction is minimized. Further, since the second slide grooves 215 for receiving the slide protrusions 221 are formed in a shape corresponding to the slide protrusions 221, it is possible to guide the folding cover 220 that is inserted into the flat covers 210.

Referring to FIGS. 2 to 4B, stoppers 218 may be provided in the second slide grooves 215 to prevent separation of the second coupling portions or the slide protrusions 221 from the second slide grooves 215. The stoppers 218 are fixed to the second slide grooves 215, for example, by bolts and prevent separation of the slide protrusions 221 from the second slide grooves 215 by coming in contact with sides of the slide protrusions 221.

A locking protrusion 227 is formed on a side of the slide protrusions 221, and one or more locking grooves 217 corresponding to the locking protrusions 227 are formed on the inner side of the slide grooves 211 or the second slide grooves 215.

The locking protrusion 227 protruding from a side of the slide protrusions 221 may protrude from both sides or any one side of the slide protrusions 221. The locking protrusions 227 may be formed with the slide protrusions 221 in the manufacturing process or may be ends, which are exposed outside through sides from the inside of the slide protrusions 221, of specific members such as bolts.

The locking grooves 217, which are grooves formed in a shape corresponding to the locking protrusions 227, are formed in the sliding direction of the folding covers 220 on the inner sides of the slide grooves 211 or the second slide grooves 215. The locking protrusions 227 that slide together when the folding cover 220 slides are locked in the locking grooves 217, thereby restricting sliding of the folding cover 220.

As sliding of the folding cover 220 is restricted by the locking grooves 217 and the locking protrusions 227, folding of the folding cover 220 is restricted. Further, as folding of the folding cover 220 is restricted, folding of the display panel 100 is restricted.

Accordingly, when there is provided a plurality of locking grooves 217, the folding angle of the display panel 100 may depend on the positions of the locking grooves 217 that are fitted on the locking protrusions 227.

For example, when the locking grooves 217 are composed of a first locking groove corresponding to the state when the display panel 100 is not folded, a second locking groove corresponding to the state when the folding angle of the display panel 100 is 90°, and a third locking groove corresponding to the state when the folding angle of the display panel 100 is 180°, the folding angle of the display panel 100 can be controlled in three steps.

The material or elasticity of the locking grooves 217 and the locking protrusions 227 are adjusted such that when a predetermined level of force is applied to the locking protrusions 227 locked in the locking grooves 217, the locking protrusions 227 come out of the locking grooves 217 and the folding cover 220 can slide again.

The folding operation of the display panel 100 according to the relative motion between the folding cover 220 having the locking grooves 217 and the locking protrusions 227 and the flat covers 210 are described in detail below.

Folding supporters 225 are disposed on the folding cover 220 to control the degree of folding of the folding cover 220 and support the flat covers 210 and the folding cover 220.

In detail, the folding supporters 225 are fixed members formed in a horseshoe shape having a U-shaped bending portion 225a, a first supporting portion 225b extending from an end of the bending portion 225a, and a second supporting portion 225c extending from the other end of the bending portion 225a.

The folding supporters 225 are coupled to the folding cover 220 at the middle portions of the bending portions 225a to be able to rotate on protrusions formed on the top of the folding cover 220.

When the display panel 100 is not folded, the folding supporters 225 are disposed without rotation on the top of the folding cover 220, and when the display panel 100 is folded, they are rotated with the first supporting portions 225b and the second supporting portions 225c supporting the outer sides on the flat covers 210 at both sides of the folding cover 220, thereby supporting the folding cover 220.

The folding supporters 225 are made of a material higher in rigidity than the folding cover 220 to support the folding cover 220 that is folded with the folding section B when the display panel 100 is folded.

Accordingly, the bending curvature of the folding cover 220 depends on the bending curvature of the bending portions 225a of the folding supporter 225, so the folding supporters 225 guide the folding cover 220 that is being folded and keep the folding cover 220 folded by preventing unfolding of the folding cover 220.

The operation of the folding supporters 225 supporting the folding cover 220 by rotating will be described in detail below.

Referring to FIGS. 6A and 6B, the coupling member 300, which is provided to couple the display panel 100 and the back cover 200 to each other, may be configured to couple the two members by fitting ends of the outer sides of the display panel 100 and the back cover 200 or may be configured to attach the inner sides of the display panel 100 and the back cover 200 to each other.

Since the display panel 100 and the back cover 200, coupled to each other by the coupling member 300 and the display panel 100, have the folding section B and the flat sections A, the portion for coupling the folding section B, which is folded with a predetermined curvature, and the back cover 200 and the portion for coupling the flat sections A and the back cover 200 should be configured differently.

Accordingly, the coupling member may include a first coupling member for coupling the flat sections A of the display panel 100 and the flat covers 210 and a second coupling member that is different from the first coupling member and couples the folding section B of the display panel 100 and folding cover 220.

Since the flat section A of the display panel 100 and the flat cover 210 are flat parts, the first coupling member may be an adhesive tape 301 for strongly fixing these two parts. The adhesive tape 301 may be various kinds of tapes in consideration of the materials of the two parts and is a double-sided tape.

The adhesive tape 301 may be provided on the entire surface of a side of each of the flat covers 210 or a plurality of adhesive patterns may be provided with predetermined gaps in a predetermined pattern to attach the display panel 100 and the flat covers 210 to each other.

The second coupling member has to bring the folding section B of the display panel 100 and the folding cover 220 in close contact with each other even though the two parts are folded and the curvature is changed, so the second coupling member has to be able change in curvature with the two parts. To this end, for example, the second coupling member may be an elastic magnetic member 303 and the elastic magnetic member 303 may be a rubber magnet.

When the magnetic member 303 is a rubber magnet, the magnetic member 303 coupling the display panel 100 and the folding cover 220, with the display panel 100 unfolded, is bent with folding of the display panel 100 and the folding cover 220, so it can keep the display panel 100 and the folding cover 220 coupled.

Further, as described above, since the display panel 100, that is an OLED panel, includes a metallic substance as a surface bonding substance, the display panel 100 can be attracted toward and attached to the folding cover 220 by the magnetic force of the magnetic member 303 attached to the folding cover 220.

The flat cover 210 is formed thicker than the folding cover 220 so that the folding cover 220 slides into the flat covers 210 or the elasticity of the folding cover 220 is increased.

Accordingly, there is no gap between the flat section A of the display panel 100 and the flat cover 210 when they are fixed by the adhesive tape 301, but there is a gap between the folding cover 220 that is thinner than the flat covers 210 and the folding section B of the display panel 100.

If the display panel 100 is folded with the gap remaining, the folding cover 220 cannot come in close contact with the folding section B, so the folding section B may become fragile.

Accordingly, a shock-absorbing pad 310 is further provided between the folding section B of the display panel 100 and the folding cover 220 to fill the gap and protect the folding section B of the display panel 100 from shock. The shock-absorbing pad 310 is disposed between the folding cover 220 and the folding section B of the display panel 100, so the shock-absorbing pad 310 may be defined as the second coupling member for coupling the two parts.

The shock-absorbing pad 310 may be made of an elastic high molecular compound and may be a foam pad made of at least one of a combination of two or more of poly-urethane, poly-olefine, poly-ethylene, poly-styrene, poly-propylene, and Ethylene-Vinyl Acetate (EVA) copolymer.

Referring to FIGS. 6B and 6B(1), the shock-absorbing pad 310 is a foam pad, and when an external force is applied, it can be pressed flat in the direction of the external force. The shock-absorbing pad 310 is inserted in the slide grooves 211 of the flat cover 210 together with the folding cover 220, and when the folding cover 220 slides, the shock-absorbing pad 310 also slides and fills the gap between the folding section B of the display panel 100 and the folding cover 220, thereby bringing the two parts in close contact with each other.

For example, when the display panel 100 is not folded, a portion of the shock-absorbing pad 310 is pressed and inserted in the slide grooves 211 of the flat covers 210. However, when the display panel 100 is folded and the shock-absorbing pad 310 is drawn out with the folding cover 220, the pressed portion is restored and fills the gap between the folding section B of the display panel 100 and the folding cover 220.

Tapered portions 219 inclined inward from the ends of the slide grooves 211 such that the width is decreased are formed to guide the shock-absorbing pads 310 being drawn out of the slide grooves 211 or being inserted back into the slide grooves 211, so the shock-absorbing pad 310 is guided when it is operated.

The process of folding the display panel 100 is described in detail with reference to FIGS. 3A, 3A(1), 3B, 4A, 4A(1), 4B, and 4B(1).

First, the foldable display device 10 when not folded is described with reference to FIGS. 3A, 3A(1), 4A, and 4A(1). Sides of the folding cover 220 are partially inserted in the slide grooves 211, whereby the folding cover has been coupled to the rear side of the display panel 100.

The slide protrusions 221 of the folding cover 220 are inserted in the second slide grooves 215 with the ends thereof in contact with the inner ends of the second slide grooves 215.

The locking protrusions 227 protruding from sides of the slide protrusions 221 of the folding cover 220 are locked and fixed in the locking grooves 217 formed in the second slide grooves 215.

Further, the folding supporters 225 on a side of the folding cover 220 are held in holes of the protrusions on a side of the folding cover 220 face each in other in pairs.

When a predetermined level of external force is applied, the locking protrusions 227 come out of the locking grooves 217 and the folding cover 220 is folded. Further, as the folding cover 220 is folded, the display panel 100 starts to be folded.

While the folding cover 220 is folded, the slide protrusions 221 slide away from the inner ends of the second slide groove 215 toward the sides of the flat covers 210. Accordingly, the folding cover 220 is drawn out of the slide grooves 211 that are side grooves of the flat covers 210.

Further, as the folding cover 220 is folded, the folding surface of the folding cover 220 is inserted into the bending portions 225a of the folding supporters 225 and pushes the folding supporters 225, and the first supporting portions 225b and the second supporting portions 225c of the folding supporters 225 are rotated to cover the folding cover 200. A torsion spring (not shown) may be additionally disposed at the middle portions of the bending portions 225a of the folding supporters 225 to supplement the rotational force of the folding supporters 225.

The folding supporters 225 are rotated to cover a side of the folding cover 220, and after the folding supporters 225 are rotated, the first supporting portions 225b and the second supporting portions 225c support the flat covers 210 in contact with the outer sides of the flat covers 210.

Semicircular guiding seats 230 are formed at the portions where the first and second supporting portions 225b and 225c of the folding supporters 225 and the flat covers 210 come in contact with each other, whereby the folding supporters 225 are guided when they are rotated.

Figure 4B:
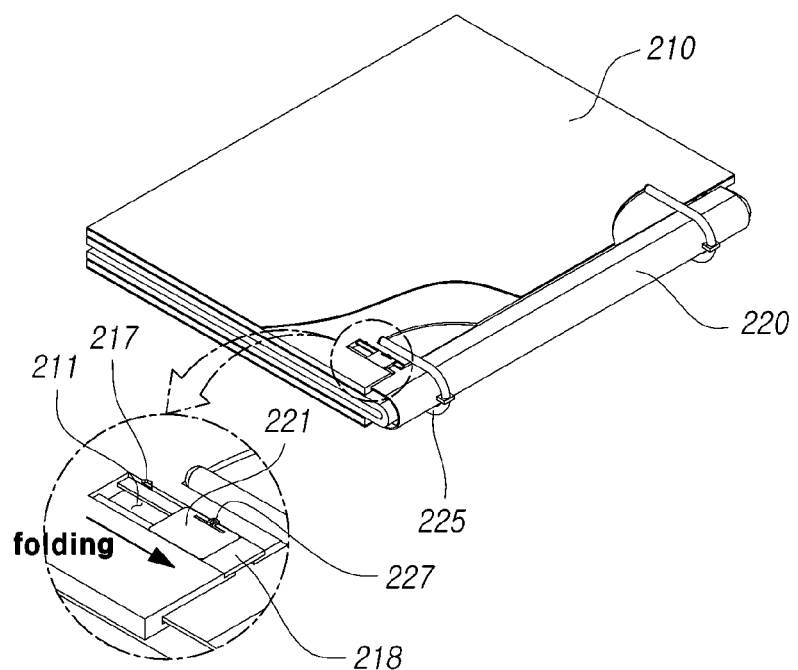

Thereafter, when the slide protrusions 221 of the folding cover 220 come in come in contact with the stoppers 218, the state shown in FIGS. 3B, 4B, and 4B(1) is completed. In this state, the locking protrusions 227 of the slide protrusions 221 are locked in the locking grooves 217, the folding supporters 225 support the flat cover 210 after rotating 90°, and the display panel 100 has been folded.

The folding angle of the display panel 100 may be 180° or more, and the lengths of the slide grooves 211 and the positions of the stoppers 218 may be adjusted to correspond to the folding angle.

When a plurality of locking grooves 217 is formed in each slide groove, the slide protrusions 221 slide and the locking protrusions 227 are locked into the locking grooves 217. Accordingly, the folding angle of the folding cover 220 can be fixed and the folding angle of the display panel 100 can also be fixed.

That is, it is possible to fix the display panel 100 at specific angles by removing an external force when the locking protrusions 227 are locked into the locking grooves 217 at specific positions while changing the folding angle of the display panel 100 by applying a predetermined level of external force such that the locking protrusions 227 are separated out of the locking grooves 217 and the folding cover 220 slides and folds. An example of fixing the display panel 100 at a specific angle was described above.

By the components for the folding operation, the display panel 100 can be folded over 180°, the folding angle can be changed step by step, and the folded state of the display panel 100 can be easily maintained.

Other embodiments of the present disclosure are described hereafter with reference to FIGS. 7A to 9.

As described above, the display panel 100 may have one or more folding sections B that are folding areas and several folding sections B may be provided.

FIGS. 7A and 7B show a foldable display device 10 having a plurality of folding sections B and a display panel 100 having the folding sections B may have a plurality of folding covers 220 for covering the folding sections B.

Further, since flat sections A are disposed at both sides of each of the folding sections B, a plurality of flat covers 210 are provided to cover the flat sections A.

The foldable display device 10, including a plurality of folding sections B, a plurality of flat sections A disposed at both sides of each of the folding sections B, folding covers 220, and flat covers 210 covering the sections, can be applied as a foldable display device including a display panel 100 having several foldable sections.

FIG. 8 shows a foldable display device 10 having a plurality of slide grooves 211 that are the first coupling portions of the flat cover 210 and a plurality of slide protrusions 221 that are the second coupling portions of the folding cover 220.

The foldable display device 10 having a plurality of slide grooves 211 and slide protrusions 221 can be used to apply a slide structure of flat covers 210 and a folding cover 220 in a large display device by firmly slide-coupling the flat covers 210 and the folding cover 220.

FIGS. 9 and 9(1) show a foldable display device 10 having slide grooves 211 having inner ends deep inside flat covers 210.

In detail, when a folding section B of a display panel 100 is not folded, a folding cover 220 or the ends of slide protrusions 221 of the folding cover 220 are not in contact with the inner ends of slide grooves 211 or second slide grooves 215.

In this case, the folding cover 220 or the slide protrusions 221 can further slide into the slide grooves 211 or the second slide grooves 215. Accordingly, when the folding cover 220 that is in the unfolded state further slides into the flat covers 210, the folding cover 220 can be folded not to the front side, but to the rear side of the display panel 100 and the display panel 100 can also be folded rearward.

Accordingly, the display panel 100 can be selectively folded forward or rearward, so it can be used to achieve a bidirectionally foldable display device 10.

Therefore, it is possible to manufacture display panels 100 having various structures, and it is possible to use the display panels for a wave-shaped display or a foldable display.

As described above, according to various embodiments of the present disclosure, it is possible to provide a back cover structure that can safely and firmly support the entire rear side of a display panel that can fold or more.

According to embodiments of the present disclosure, in a foldable display device, a display panel does not separate from or slip on a back cover supporting the display panel when the display panel is folded, so the folding section of the display panel can be firmly supported.

Further, according to embodiments of the present disclosure, it is possible to provide a foldable display device that can be stably folded even without a specific mechanism.

Another aspect of the present disclosure is to provide a foldable display device having a coupling structure that is suitable for a folding situation and keeps a display panel and a back cover strongly coupled to each other.

Even if it was described above that all of the components of an embodiment of the present disclosure are coupled as a single unit or coupled to be operated as a single unit, the present disclosure is not necessarily limited to such an embodiment. That is, at least two elements of all structural elements may be selectively joined and operate without departing from the scope of the present disclosure.

In addition, since terms, such as "including," "comprising," and "having" mean that one or more corresponding components may exist unless they are specifically described to the contrary, it shall be construed that one or more other components can be included. All the terms that are technical, scientific or otherwise agree with the meanings as understood by a person skilled in the art unless defined to the contrary. Common terms as found in dictionaries should be interpreted in the context of the related technical writings not too ideally or impractically unless the present disclosure expressly defines them so.

Although a preferred embodiment of the present disclosure has been described for illustrative purposes, those skilled in the art will appreciate that various modifications, additions and substitutions are possible, without departing from the scope and spirit of the disclosure as disclosed in the accompanying claims. Therefore, the embodiments disclosed in the present disclosure are intended to illustrate the scope of the technical idea of the present disclosure, and the scope of the present disclosure is not limited by the embodiment. The scope of the present disclosure shall be construed on the basis of the accompanying claims in such a manner that all of the technical ideas included within the scope equivalent to the claims belong to the present disclosure.

What is claimed is:

1. A foldable display device comprising:
   a foldable display;
   a back cover configured to cover a rear side of the foldable display; and
   a coupling member configured to couple the foldable display and the back cover to each other,
   wherein the foldable display has one or more folding sections that are folding areas and flat sections disposed at both sides of each of the folding sections,
   the back cover includes folding covers covering the folding sections and flat covers covering the flat sections,
   the folding covers and the flat covers are connected to each other,
   the folding covers each have one or more first coupling portions for connection with the flat covers,
   the flat covers each have one or more second coupling portions for connection with the folding covers to be coupled to the first coupling portions, and
   when the folding sections are folded, the coupling state between the first coupling portions and the second coupling portions is changed.

2. The foldable display device of claim 1, wherein the first coupling portions and the second coupling portions are slide-coupled.

3. The foldable display device of claim 2, wherein the first coupling portions are slide protrusions and the second coupling portions are slide grooves in which the slide protrusions are inserted.

4. The foldable display device of claim 3, wherein the slide protrusions are formed on top of the folding covers, and
   the slide grooves are formed on sides of the flat covers, which are connected with the folding covers.

5. The foldable display device of claim 1, wherein the flat covers are thicker than the folding covers.

6. The foldable display device of claim 1, wherein materials of the flat covers and the folding covers are different.

7. The foldable display device of claim 1, wherein side grooves in which sides of the folding covers are partially inserted are formed at sides of the flat covers,
   the sides of the folding covers are partially inserted in the side grooves when the folding sections are not folded, and
   the sides of the folding covers are drawn out of the side grooves when the folding sections are folded.

8. The foldable display device of claim 7, wherein the side grooves of the flat cover each have:
   a first slide groove in which a body of the folding cover is partially inserted; and
   one or more second slide grooves formed in the first slide groove to receive the first coupling portions protruding from the body of the folding cover.

9. The foldable display device of claim 8, wherein the first coupling portions are slide protrusions and the second coupling portions are the second slide grooves.

10. The foldable display device of claim 8, wherein a stopper is disposed in the second slide grooves to prevent separation of the first coupling portions from the second slide grooves.

11. The foldable display device of claim 3, further comprising:
    a locking protrusion formed on a side of the slide protrusions; and
    one or more locking grooves formed on inner sides of the slide grooves to correspond to the locking protrusions.

12. The foldable display device of claim 11, wherein when a plurality of locking grooves is provided, a folding angle of the display panel is changed in accordance with positions of the locking grooves locked to the locking protrusions.

13. The foldable display device of claim 1, wherein folding supporters having a U-shaped bending portion, a first supporting portion disposed at an end of the bending portion, and a second supporting portion disposed at another end of the bending portion are disposed on the folding cover, and
    the folding supporters can be rotated about a middle portion of the bending portion.

14. The foldable display device of claim 13, wherein the folding supporters are on top of the folding cover when the folding section is not folded, and when the folding section is folded, the folding supporters are rotated and the first supporting portion and the second supporting portion of the folding supporters support outer sides of the flat covers disposed at both sides of the folding cover.

15. The foldable display device of claim 13, wherein the folding supporters guide the folding covers when the folding cover is folded such that the folding cover is folded to correspond to a bending curvature of the bending portion.

16. The foldable display device of claim 3, wherein the slide grooves are formed inside such that inner ends of the slide grooves do not come in contact with ends of the folding cover when the folding section is not folded, so the foldable display is selectively folded forward or rearward.

17. The foldable display device of claim 1, wherein the coupling member includes:
 a first coupling member configured to couple the flat sections of the display panel and the flat covers to each other; and
 a second coupling member being different in kind from the first coupling member and configured to couple the folding section of the display panel and the folding cover to each other.

18. The foldable display device of claim 17, wherein the first coupling member is an adhesive tape, and
 the second coupling member is an elastic magnetic member.

19. The foldable display device of claim 18, further comprising a shock-absorbing pad between the folding section of the display panel and the folding cover.

20. A foldable display device comprising:
 a foldable display;
 a back cover configured to cover a rear side of the foldable display; and
 a coupling member configured to couple the foldable display and the back cover to each other,
 wherein the back cover includes:
 flat covers corresponding to flat sections of the foldable display; and
 a folding cover corresponding to a folding section of the foldable display,
 the folding cover is thinner than the flat covers,
 the coupling member includes a first coupling member configured to couple the flat sections of the foldable display and the flat covers to each other and a second coupling member configured to couple the folding section of the foldable display and the folding cover to each other, and
 the first coupling member and the second coupling member are different in material or structure.

21. The foldable display device of claim 20, wherein the first coupling member includes an adhesive tape coupling the flat sections of the display panel and the flat cover to each other, and
 the second coupling member includes an elastic magnetic member coupling the folding section of the display panel and the folding cover to each other.

22. The foldable display device of claim 21, wherein the second coupling member further includes a shock-absorbing pad disposed between the folding section of the display panel and the folding cover,
 the folding cover is inserted in the flat covers to slide, and
 the shock-absorbing pad is inserted in the flat covers together with the folding cover to bring the folding section of the display panel and the folding cover in close contact with each other by sliding with the folding cover when the foldable display is folded.

* * * * *